July 14, 1970 H. M. PENSACK ET AL 3,520,054

METHOD OF MAKING MULTILEVEL METALLIZED CERAMIC BODIES FOR SEMICONDUCTOR PACKAGES

Filed Nov. 13, 1967

INVENTORS
Harvey M. Pensack
Gary Hillman

Jack Schuman
ATTORNEY

United States Patent Office 3,520,054

Patented July 14, 1970

3,520,054

METHOD OF MAKING MULTILEVEL METALLIZED CERAMIC BODIES FOR SEMICONDUCTOR PACKAGES

Harvey M. Pensack and Gary Hillman, Livingston, N.J., assignors to Mitronics Inc., Murray Hill, N.J.

Filed Nov. 13, 1967, Ser. No. 682,108

Int. Cl. H05k *3/28*; B23p *17/00*

U.S. Cl. 29—627 3 Claims

ABSTRACT OF THE DISCLOSURE

Flat green ceramic body is metallized in a selected pattern and coined to produce a multilevel ceramic body with the desired arrangement of metallizing on all the levels. The selectively metallized multilevel ceramic body is then cured and cooled. A semiconductor is mounted in the recess formed by the coining operation and is electrically connected to the metallized areas. The ceramic body with attached semiconductor may be potted, or provided with a lid hermetically sealing the semiconductor in the coined recess, and may be mounted to a printed circuit board or may be provided with external leads.

BACKGROUND OF THE INVENTION

This invention relates to the method of making a selectively metallized multilevel ceramic body to which a semiconductor can be attached and electrically connected to the several metallized areas.

Such ceramic bodies may have a low profile, and are readily directly attached to printed circuit boards, or may simply be provided with external leads.

Previous techniques for making selectively metallized multilevel ceramic bodies for this purpose were expensive and involved additional and difficult steps over the steps of the present invention, such as separately metallizing the several levels of the ceramic body to be metallized, after firing, or by removing, as a final step, metallizing from the ceramic body in those areas where the metallizing was not desired. Thus, U.S. Pat. 3,271,507 (1966) to Elliott shows the following sequence of steps:

(a) Forming green blanks, then (b) Metallizing, then (c) Firing, then (d) Removing metallizing where not desired in the finished article.

SUMMARY OF THE INVENTION

One of the objects of this invention is to provide an improved method for making a selectively metallized multilevel ceramic body.

A further object of this invention is to provide a relatively inexpensive, yet accurate, method for making a selectively metallized multilevel ceramic body to which a semiconductor can be attached and electrically connected to the several metallized areas.

Yet other and further objects of this invention will become apparent during the course of the following description and by reference to the accompanying drawing and appended claims. It has been discovered that the foregoing objects can be attained by metallizing a flat green ceramic body in a selected pattern and then coining the metallized flat green ceramic body to selectively displace predetermined areas thereof, along with the applied metallizing, to produce the multilevel ceramic body with the desired pattern of metallizing on the several planes or levels thereof. The ceramic body may now be cured or fired, and cooled, and is ready to receive the semiconductor.

DESCRIPTION OF THE PREFERRED EMBODIMENT

Figures 1, 2, 3, 4, 5, 6, 7:
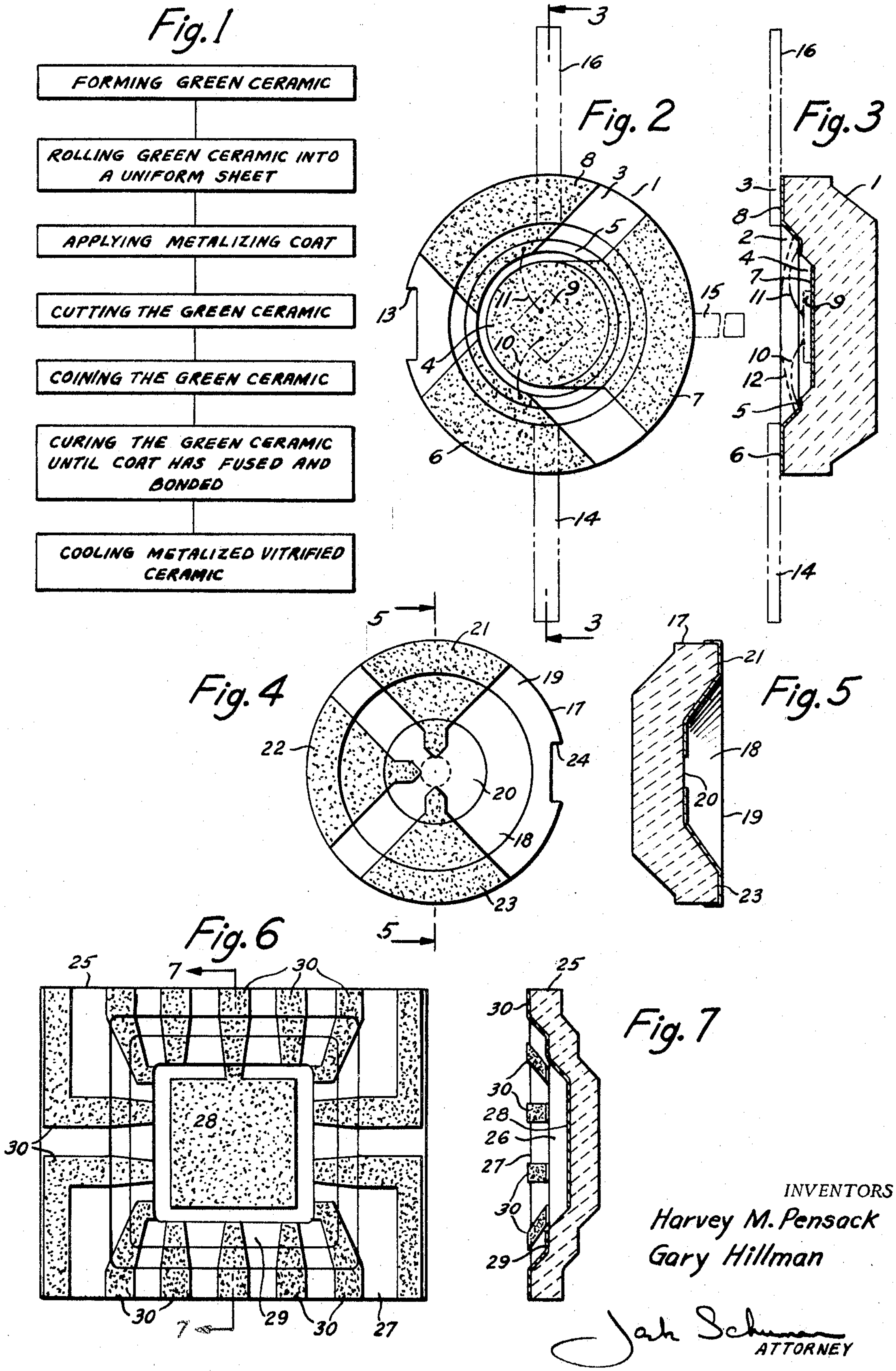
FIG. 1 represents diagrammatically the sequence of steps employ in practicing the present invention.
FIG. 2 represents a view in plan of a metallized multilevel ceramic body made by the method of the present invention, showing in phantom a semiconductor and various leads attached thereto.
FIG. 3 represents a view in section taken along the line 3—3 of FIG. 2.
FIG. 4 represents a view in plan of another form of metallized multilevel ceramic body made by the method of the present invention.
FIG. 5 represents a view in section taken along the line 5—5 of FIG. 4.
FIG. 6 represents a view in plan of yet another form of metallized multilevel ceramic body made by the method of the present invention.
FIG. 7 represents a view in section taken along the line 7—7 of FIG. 6.

The sequence of steps involved in the method of making the metallized multilevel ceramic bodies herein disclosed is indicated diagrammatically in FIG. 1. These steps follow the sequence of steps disclosed in U.S. Pat. 3,074,143 (1963) to Baynard R. Smtih, except for the interposition of the step of "coining the green ceramic" before the step of "curing the green ceramic until coat has fused and bonded." These steps will now be described in sequence and in greater detail.

(1) Forming green ceramic

The first step is to prepare the basic material for the ceramic body. The usual ceramic material may be used. Aluminum oxide is satisfactory although there are many other well known materials. The ceramic material is mixed with a fluid vehicle, a binder, and a plasticizing agent. It is then cast into sheets or strips. To hasten the congealing, the temperature of the ceramic may be raised to approximately 160° F. depending upon the composition of the ceramic material, plasticizer or binder and vehicle. The ceramic material may also be cast in trays. There are numerous other methods of forming green ceramic bodies which are plastic.

A specific example of a composition for preparing green ceramic bodies is as follows: aluminum oxide 96% by weight, talc 2% by weight, clay 2% by weight. These ingredients are thoroughly mixed. A vehicle, benzol, is added in sufficient amount to form a thick slurry. For 100 pounds of solid ingredients, about 30 pounds of vehicle should be sufficient to produce the proper thick creamy consistency. To the mixture, approximately 5 pounds of polystyrene are added as a plasticizing agent. The mixture may be poured into trays of proper depth to form sheets of desired thickness, which sheets can in turn be cut into strips. To hasten congealing, the trays may be moved through a heated zone having a temperature of 160° F. to cure the ceramic to a relatively dry, though flexible, state.

(2) Rolling green ceramic into a uniform sheet

The green ceramic produced in step (1) above may if necessary be rolled to produce a sheet of green ceramic having uniform thickness.

(3) Applying metallizing coat

A metallic coat is applied to selected portions on a flat surface of the green ceramic body in accordance with the areas of the ceramic body which are required to be metallized. That is to say, the pattern of the metallizing coat applied to the flat surface of the green ceramic body corresponds with the pattern of metallizing desired on the several levels of the finished multilevel ceramic body projected to the plane of the flat surface. The metallic coat can be applied in several ways, as by silk screening or by rolling. There are numerous metal powder coating compositions well known in the metallizing industry, such as tungsten powder and molybdenum powder in varying proportions, or molybdenum powder and manganese powder in the ratio 95:5 by weight, etc. A specific example of one metallizing composition to be applied to a ceramic body is molybdenum powder of 325 mesh or finer. A quantity of this powder is mixed in amyl acetate as a vehicle to form a syrupy material, one part by weight of methyl cellulose being added as a binder for the powder as the coat dries.

(4) Cutting the green ceramic

The metallized sheet or strip of green ceramic may be cut into individual pieces subsequently to be coined and cured to form the finished ceramic body. This cutting step may, if desired, be performed simultaneously with, or even subsequent to, the coining step next described. Under some circumstances, the cutting step might even be performed prior to the metallizing operation.

(5) Coining the green ceramic

The metallized green ceramic body is now coined to produce the desired arrangement of plural levels, i.e., the thickness of predetermined areas thereof is reduced by displacement of material or, viewing it another way, selected areas of the green ceramic body with the metallizing coat applied thereto are displaced substantially perpendicularly away from the flat surface of the green ceramic body. The purpose of this step is to produce the several levels or planes desired in the final multilevel article with the desired pattern of metallizing on each of the several levels, without any furhter metallizing operation. This is quite different and distinct from prior art practices as shown, for example, in U.S. Pat. 3,271,507 (1966) to Elliott wherein, after the firing step, metallizing must be removed where not desired in the finished article.

(6) Curing the green ceramic until coat has fused and bonded

The firing of the plasticized metallized coined green ceramic body may now be performed in the usual furnace in a reducing or an inert atmosphere. In a specific example of practice, the metallized coined green ceramic bodies are placed on a conveyor belt or on a metal sheet or are moved in any suitable manner through a furnace where a maximum temperature of approximately 3100° F. is reached. The exact temperature is dependent on the ceramic material used, and must be sufficient to vitrify the ceramic and to fuse it to the metal coat. The atmosphere of the furnace should be a reducing gas, such as hydrogen, carbon monoxide, ammonia or other reducing gases, or may be an inert gas in order to avoid oxidation of the metallizing. External heat applied to the furnace by gas or electricity raises the temperature of the ceramic progressively in zones as the ceramic moves through the furnace. The maximum temperature reached is in the central zone of the furnace through which the ceramic body may pass in approximately one hour. The firing time set forth is applicable to bodies approximately ⅛ inch in thickness. Thicker bodies may require a longer firing time. Very thin bodies may be fired for an even shorter period. The green ceramic vitrifies and forms a hard, dense body which fuses with the metal coat and forms a metal-to-ceramic bond of great tenacity. The binder, the plasticizer and the solvert for the ceramic body are decomposed leaving no significant residue in the ceramic body. The vehicle for the metal powder and the binder are also decomposed, leaving no significant residue in the metal coat.

(7) Cooling metallized vitrified ceramic

After leaving the hot zone of the furnace, the cooling-off phase in the process of making the ceramic body proceeds with gradually lowering temperatures for approximately one hour.

At the conclusion of the foregoing sequence of steps, a multilevel selectively metallized ceramic body or substrate is obtained. Certain other steps are thereafter taken, as hereinafter described, to mount the semiconductor to the ceramic body and to complete the package.

FIGS. 2 and 3 show one typical form of ceramic body 1 produced by the method hereinbefore described. Ceramic body 1 is circular in plan, and has a circular recess 2 in one face 3 thereof. Circular base 4 lies at the center of circular recess 2, and annular ring 5 circumscribes circular base 4. Metallizing, in the form of metal coats 6, 7 and 8, has been provided as shown, the said metal coats 6, 7 and 8, being electrically isolated from each other. It will be understood that the surface of the original flat green ceramic body had been metallized in substantially the pattern shown in FIG. 2 by silk screening or roller techniques, and that the coining operation displaced those portions of the green ceramic body with the applied metallizing subsequently to form said circular base 4 and annular ring 5. That is to say, the coining operation displaced the plane of the top of annular ring 5, with applied metallizing, below the plane of the face 3 of the ceramic body, and displaced the plane of the circular base 4, with applied metallizing, below the planes of the face 3 of the ceramic body and the top of the annular ring 5. Semiconductor 9, shown diagrammatically in phantom in FIGS. 2 and 3, is suitably mounted to metal coat 7 on circular base 4, in electrical contact therewith. Semiconductor 9 being a transistor, two other electrical connections are made, from pertinent portions of the semiconductor 9 through wires 10 and 11 connected thereto, shown in phantom in FIGS. 2 and 3, the said wires 10 and 11 being connected to metal coats 6 and 8 respectively. Thus, the three metal coats 6, 7 and 8 are each connected to separate electrically pertinent portions of semiconductor 9. Potting 12 may be applied, if desired, as shown in phantom in FIG. 3, the top of the potting 12 preferably not extending above the face 3 of the ceramic body 1.

Ceramic body 1, with attached semiconductor 9, may be mounted directly to a printed circuit board (not shown), face 3 being placed in contact with the said printed circuit board and metal coats 6, 7 and 8 suitably oriented and soldered to the board, identification notch 13 being provided in the periphery of ceramic body 1 to aid in orientation. Alternatively, leads 14, 15 and 16, shown in phantom in FIGS. 2 and 3, may be attached, as by means of parallel gap welding or soldering or brazing or other suitable techniques, to metal coats 6, 7 and 8, respectively, and subsequently connected to the desired circuit. In lieu of potting, a lid (not shown) may be soldered to the annular ring 5 of the ceramic body 1 by suitable techniques and the semiconductor 9 hermetically sealed within recess 2.

FIGS. 4 and 5 show another typical form of ceramic body 17 produced by the method of the present invention as hereinbefore described, and generally resembles the form shown in FIGS. 2 and 3 but with the annular ring omitted. Ceramic body 17 is circular in plan, and has a circular recess 18 in one face 19 thereof, circular base 20 lying at the bottom of circular recess 18. Metallizing, in the form of metal coats 21, 22 and 23, has been provided as shown, the said metal coats 21, 22 and 23 being electrically isolated from each other. It will be understood that the surface of the original flat green ceramic body had been metallized in substantially the pattern shown in FIG. 4 by silk screening or roller techniques, and that the coining operation displaced those portions of the green ceramic body with the applied metallizing subsequently to form said circular base 20. That is to say, the coining operation displaced the plane of the circular base 20, with applied metallizing, below the plane of the face 19 of the ceramic body 17. In a manner similar to that described in connection with the species of FIGS. 2 and 3, a semiconductor (not shown) can be suitably mounted adjacent circular base 20 and the appropriate electrical connections made between other portions of the semiconductor and the several metal coats herein shown. Leads similar to leads 14, 15 and 16 of the species of FIGS. 2 and 3 may be employed, or the ceramic body 17 with attached semiconductor may be mounted to a printed circuit board as heretofore described (identification notch 24 being provided to facilitate orientation). Potting may be applied over the semiconductor, if desired, or a lid may be suitably soldered within circular recess 18 to the conical wall circumscribing the said circular recess 18 to provide a hermetic seal for the semiconductor.

FIGS. 6 and 7 show yet another typical form of ceramic body 25 produced by the method hereinbefore described. Ceramic body 25 is rectangular in plan, and has a rectangular recess 26 in one face 27 thereof. Rectangular base 28 lies at the center of rectangular recess 26, and annular rectangle 29 may circumscribe rectangular base 28. Metallizing, in the form of a plurality of separate metal coats 30, has been provided, each of the said metal coats 30 being electrically isolated from the other metal coats 30. It will be understood that the surface of the original flat green ceramic body had been metallized in substantially the pattern shown in FIG. 6 by silk screening or roller techniques, and that the coining operation displaced those portions of the green ceramic body with the applied metallizing subsequently to form said rectangular base 28 and annular rectangle 29. That is to say, the coining operation displaced the plane of the top of the annular rectangle 29, with applied metallizing, below the plane of the face 27 of the ceramic body 25, and displaced the plane of the rectangular base 28, with applied metallizing, below the planes of the face 27 and the top of the annular rectangle 29 of the ceramic body. In a manner similar to that described in connection with the species of FIGS. 2 and 3, a semiconductor (not shown) may be suitably mounted to the metallizing on rectangular base 28, and suitable electrical connections made between various portions of the semiconductor and the other metal coats 30. Potting may be applied over the semiconductor, if desired, or a lid suitably soldered to annular rectangle 29 forming a hermetic seal for the semiconductor. The ceramic body 25 with attached semiconductor may be mounted to a printed circuit board, or leads similar to leads 14, 15 and 16 of FIGS. 2 and 3 may be employed, all as hereinbefore described.

What is claimed is:

1. The method of making multiple multilevel ceramic bodies, each multilevel ceramic body of said multiple of multilevel ceramic bodies having a selected pattern of metallizing bonded to the several levels thereof, said method comprising:

(a) forming a sheet of green ceramic with a flat surface having dimensions sufficient to encompass said multiple of multilevel ceramic bodies, (b) applying a coat of metallizing to the flat surface of said sheet of green ceramic in a pattern corresponding with the pattern of metallizing desired on the several levels of the multiple of multilevel ceramic bodies projected to the plane of the said flat surface, (c) displacing selected areas of the green ceramic with the coat of metallizing applied thereto away from the plane of the said flat surface to leave a portion of the said flat surface remaining and constituting a first level having a pattern of metallizing thereon, the selected displaced areas constituting a second level, said first and second levels being joined by a wall having metallizing thereon, metallizing on said second level being electrically connected to metallizing on said first level through metallizing on said wall, and simultaneously with said displacing, cutting said green ceramic to permit said multiple multilevel ceramic bodies to be separated from each other, (d) curing the green ceramic and bonding the coat of metallizing thereto thereby to obtain said multiple of multilevel ceramic bodies.

2. The method of claim 1, step (c) comprising displacing selected areas of the green ceramic with the coat of metallizing applied thereto away from the plane of the said flat surface to leave a portion of the said flat surface remaining and constituting a first level having a pattern of metallizing thereon and whereby the selected displaced areas constitute a series of second levels removed by varied distances from the plane of the said flat surface, said second levels and said first level being joined by a series of walls having metallizing thereon, metallizing on the said series of second levels being electrically connected to metallizing on said first level through metallizing on said walls.

3. The method of claim 1 applied to the manufacture of semiconductor packages, further comprising:

(e) in each multilevel ceramic body of said multiple of multilevel ceramic bodies, said first level surrounding said second level whereby said multilevel ceramic body has a recess extending inwardly thereof from the said flat surface, (f) mounting a semiconductor to each multilevel ceramic body within the said recess, (g) connecting selected portions of the said semiconductor to selected portions of the coat of metallizing on the several levels of the said multilevel ceramic body, (h) enclosing the said semiconductor within the said recess.

References Cited

UNITED STATES PATENTS

| | | | |
|---|---|---|---|
| 3,378,704 | 4/1968 | Miller et al. | 310—9.4 |
| 3,404,214 | 10/1968 | Elliott | 29—626 XR |
| 2,981,981 | 5/1961 | Luhn | 29—625 |
| 3,189,978 | 6/1965 | Stetson | 29—625 |
| 3,192,086 | 6/1965 | Gyurk. | |
| 3,235,939 | 2/1966 | Rodriguez et al. | 317—258 |

OTHER REFERENCES

IBM Tech. Disclosure Bulletin, vol. 8, No. 11, 114–66 (p. 1494).

JOHN F. CAMPBELL, Primary Examiner

R. W. CHURCH, Assistant Examiner

U.S. Cl. X.R.

29—25.35, 25.42, 58, 420, 528, 577, 610, 626; 65—18; 117—212; 174—52, 68.5; 264—61, 132, 133, 135; 317—101, 258; 339—17